United States Patent
Suzuki

(10) Patent No.: US 12,385,127 B2
(45) Date of Patent: Aug. 12, 2025

(54) FILM FORMING APPARATUS AND FILM FORMING METHOD

(71) Applicant: TOKYO ELECTRON LIMITED, Tokyo (JP)

(72) Inventor: Yasunobu Suzuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/477,060

(22) Filed: Sep. 28, 2023

(65) Prior Publication Data

US 2024/0117486 A1 Apr. 11, 2024

(30) Foreign Application Priority Data

Oct. 11, 2022 (JP) ................. 2022-163116

(51) Int. Cl.
| | |
|---|---|
| C23C 14/34 | (2006.01) |
| C23C 14/16 | (2006.01) |
| C23C 14/50 | (2006.01) |
| H01J 37/32 | (2006.01) |
| H01J 37/34 | (2006.01) |

(52) U.S. Cl.
CPC .......... *C23C 14/3464* (2013.01); *C23C 14/16* (2013.01); *C23C 14/505* (2013.01); *H01J 37/32651* (2013.01); *H01J 37/3447* (2013.01); *H01J 37/3476* (2013.01)

(58) Field of Classification Search
CPC ............ H01J 37/32651; H01J 37/3447; H01J 37/3476; C23C 14/3464; C23C 14/16; C23C 14/505; C23C 14/545
USPC ........................... 204/298.03, 298.11, 192.13
See application file for complete search history.

(56) References Cited

U.S. PATENT DOCUMENTS

| | | | |
|---|---|---|---|
| 9,790,590 B2 | 10/2017 | Furukawa et al. | |
| 2007/0246356 A1* | 10/2007 | Tokimitsu | ........... C23C 14/3464 |
| | | | 204/298.02 |
| 2013/0081942 A1* | 4/2013 | Hinata | ................... C23C 14/545 |
| | | | 204/192.1 |
| 2015/0187546 A1 | 7/2015 | Furukawa et al. | |

FOREIGN PATENT DOCUMENTS

| | | | | |
|---|---|---|---|---|
| WO | WO 2013/179575 A1 | | 12/2013 | |
| WO | WO-2020161957 A1 | * | 8/2020 | ......... C23C 14/0036 |
| WO | WO 2022056344 | * | 3/2022 | |

OTHER PUBLICATIONS

Machine Translation WO 2020161957 (Year: 2020).*

* cited by examiner

Primary Examiner — Rodney G McDonald
(74) Attorney, Agent, or Firm — Fenwick & West LLP

(57) ABSTRACT

A film forming apparatus for performing film formation on a substrate comprises a processing chamber, a stage configured to place thereon a substrate disposed in the processing chamber, a film forming part configured to perform film formation on the substrate placed on the stage, a shutter that is movable between a shielding position where the substrate on the stage is shielded and a retracted position retracted from the stage and where the film forming part performs the film formation on the substrate, and a film thickness measuring part. The film thickness measuring part has a film thickness measuring device configured to measure a film thickness of a film formed on the shutter at the shielding position by the film forming part.

12 Claims, 4 Drawing Sheets

FILM FORMING APPARATUS AND FILM FORMING METHOD

CROSS-REFERENCE TO RELATED APPLICATIONS

This application claims priority to Japanese Patent Application No. 2022-163116, filed on Oct. 11, 2022, the entire contents of which are incorporated herein by reference.

TECHNICAL FIELD

The present disclosure relates to a film forming apparatus and a film forming method.

BACKGROUND

In manufacturing electronic devices such as semiconductor devices, film formation for forming a film on a substrate is performed. A film forming apparatus disclosed in International Publication No. WO 2013/179575 is known as an example of a film forming apparatus used for the film formation.

SUMMARY

The present disclosure provides a film forming apparatus capable of preventing abnormal film formation in the case of forming a film on a substrate.

One aspect of the present disclosure provides a film forming apparatus for performing film formation on a substrate, comprising: a processing chamber; a stage configured to place thereon a substrate disposed in the processing chamber; a film forming part configured to perform film formation on the substrate placed on the stage; a shutter that is movable between a shielding position where the substrate on the stage is shielded and a retracted position retracted from the stage and where the film forming part performs the film formation on the substrate; and a film thickness measuring part having a film thickness measuring device configured to measure a film thickness of a film formed on the shutter at the shielding position by the film forming part.

DETAILED DESCRIPTION

Hereinafter, embodiments will be described in detail with reference to the accompanying drawings.

Figure 1:
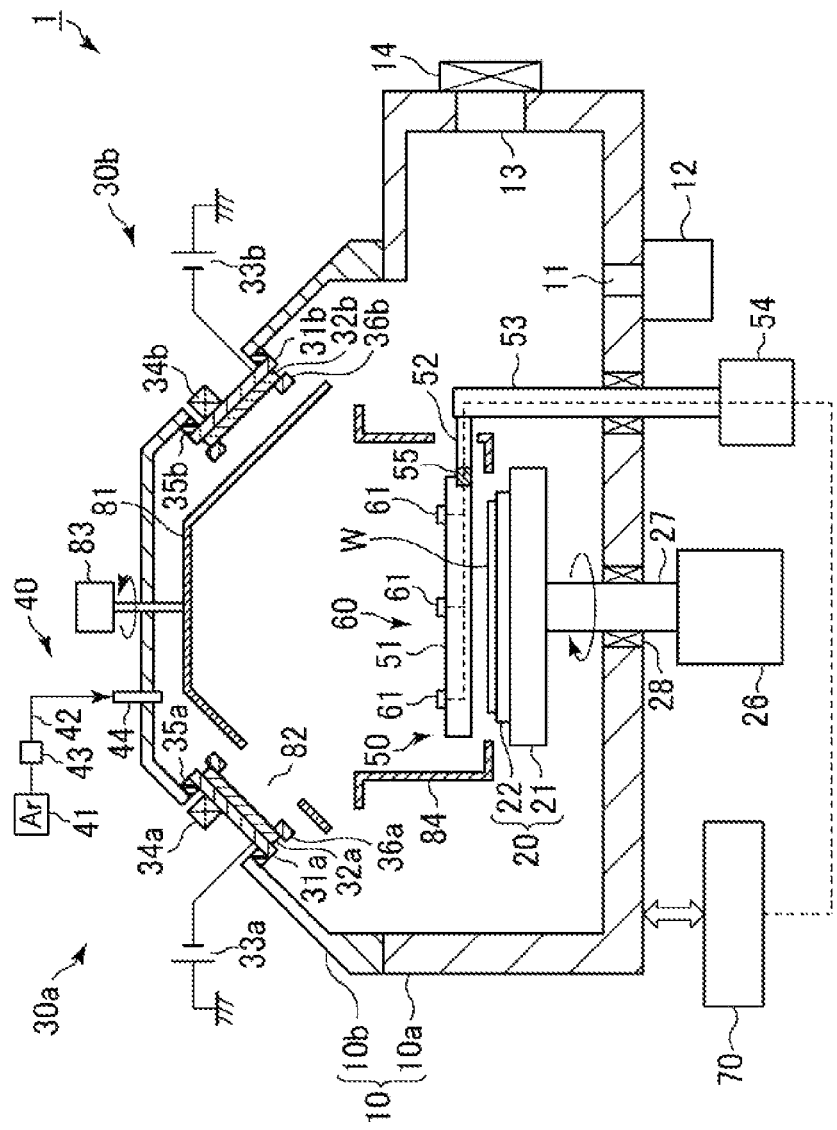
FIG. 1 is a cross-sectional view showing an example of a film forming apparatus according to one embodiment.
Figure 2:
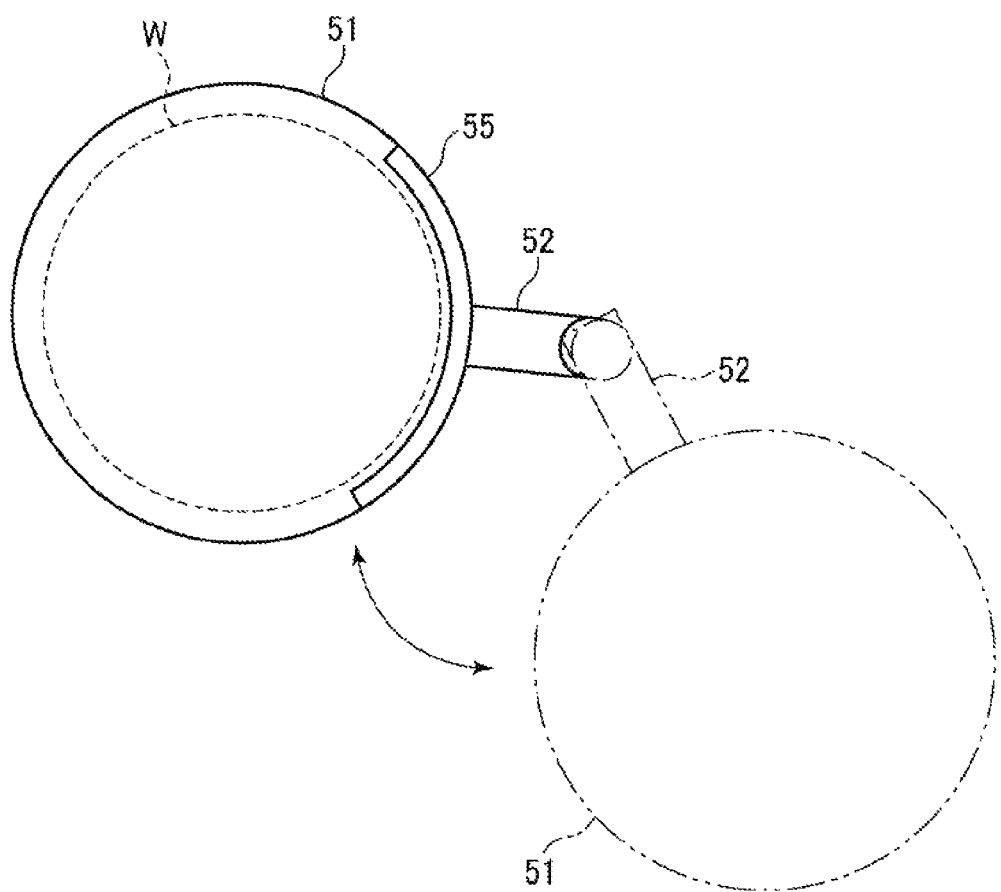
FIG. 2 explains a swiveling operation of a disc shutter in the film forming apparatus of FIG. 1.
Figure 3:
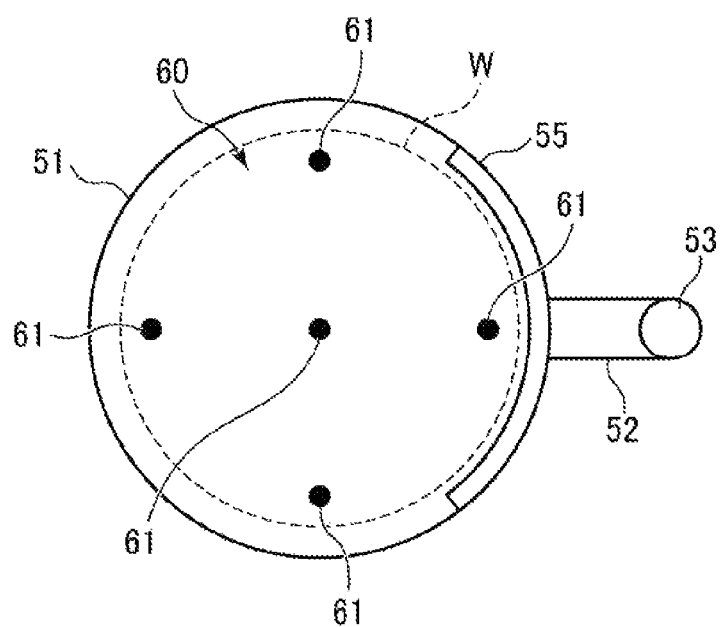
FIG. 3 is a plan view showing a film thickness measuring part disposed at the disc shutter in the film forming apparatus of FIG. 1.
Figure 4:
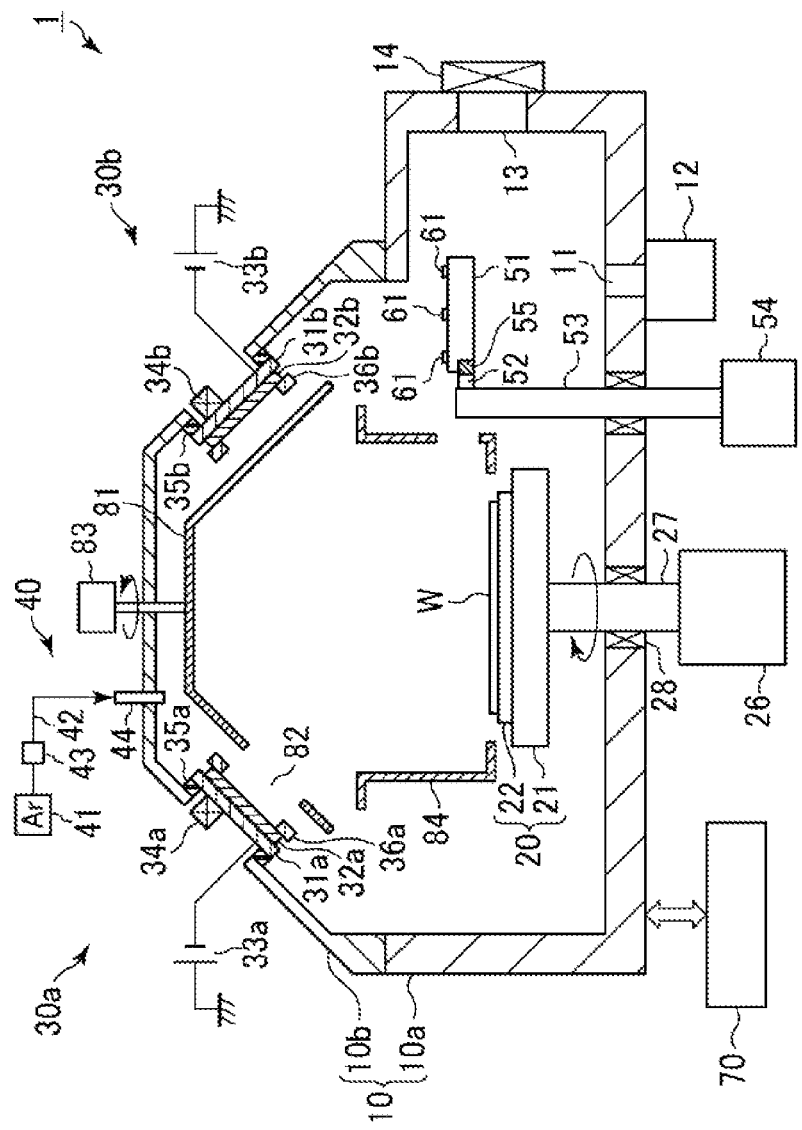
FIG. 4 is a cross-sectional view showing a state in which the disc shutter is retracted in the film forming apparatus of FIG. 1.

FIG. 1 is a cross-sectional view showing an example of a film forming apparatus according to one embodiment. FIG. 2 explains a swiveling operation of a disc shutter in the film forming apparatus of FIG. 1. FIG. 3 is a plan view showing a film thickness measuring part disposed at the disc shutter in the film forming apparatus of FIG. 1. FIG. 4 is a cross-sectional view showing a state in which the disc shutter is retracted in the film forming apparatus of FIG. 1.

The film forming apparatus 1 is configured as a sputtering apparatus for forming a film on a substrate W by sputtering (sputtering film formation). The substrate W may be a wafer made of a semiconductor such as Si, glass, ceramic, or the like, but is not limited thereto.

The film forming apparatus 1 includes a processing chamber 10, a stage 20, sputtered particle emitting parts 30a and 30b, a gas supply part 40, a disc shutter part 50, a film thickness measuring part 60, and a controller 70.

The processing chamber 10 is made of aluminum, for example, and defines a processing space for processing the substrate W. The processing chamber 10 is connected to a ground potential. The processing chamber 10 has a chamber body 10a with an upper opening, and a lid 10b disposed to close the upper opening of the chamber body 10a. The lid 10b has a truncated cone shape.

An exhaust port 11 is formed at the bottom portion of the processing chamber 10, and an exhaust device 12 is connected to the exhaust port 11. The exhaust device 12 includes a pressure control valve and a vacuum pump, and the processing chamber 10 is evacuated to a predetermined vacuum level by the exhaust device 12.

A loading/unloading port 13 for loading/unloading the substrate W to/from an adjacent transfer chamber (not shown) is formed in the sidewall of the processing chamber 10. The loading/unloading port 13 is opened and closed by a gate valve 14.

The stage 20 has a substantially disc shape, and is disposed near the bottom portion of the processing chamber 10. The stage 20 is configured to hold the substrate W horizontally. In the present embodiment, the stage 20 has a base portion 21 and an electrostatic chuck 22. The base portion 21 is made of aluminum, for example. The electrostatic chuck 22 is made of a dielectric material, and has an electrode (not shown) therein. A DC voltage is applied from a DC power supply (not shown) to the electrode, and the substrate W is electrostatically attracted to the surface of the electrostatic chuck 22 by an electrostatic force thus generated. A temperature control mechanism (not shown) having one or both of a heater and a cooling medium channel is disposed in the base portion 21.

The stage 20 is driven by a driving mechanism 26. The driving mechanism 26 is disposed below the processing chamber 10. A support shaft 27 extending upward from the driving mechanism 26 extends while penetrating through the bottom wall of the processing chamber 10, and the tip end thereof is connected to the center of the bottom surface of the stage 20. The driving mechanism 26 is configured to rotate and vertically move the stage 20 via the support shaft 27. A sealing member 28 seals the gap between the support shaft 27 and the bottom wall of the processing chamber 10. By providing the sealing member 28, the support shaft 27 can be rotated and vertically moved in a state where the processing chamber 10 is maintained in a vacuum state. The sealing member 28 may be, for example, a magnetic fluid seal.

The sputtered particle emitting parts 30a and 30b function as processing mechanisms for performing sputtering film formation. The sputtered particle emitting parts 30a and 30b have target holders (electrodes) 31a and 31b, targets 32a and 32b, power supplies 33a and 33b, and magnets 34a and 34b, respectively.

The target holders 31a and 31b are made of a conductive material, and are attached to different positions on the inclined surface of the lid 10b of the processing chamber 10 via insulating members 35a and 35b, respectively. In this example, the target holders 31a and 31b are disposed at positions facing each other. However, the present disclosure is not limited thereto, and they may be disposed at any other positions.

The targets 32a and 32b are held by the target holders 31a and 31b, respectively, and have a rectangular shape. The targets 32a and 32b are made of a material containing constituent elements of a film to be formed. The targets 32a and 32b may be made of, but not limited to, a metal such as Mg.

The power supplies 33a and 33b are DC power supplies, and supply a power to the targets 32a and 32b via the target holders 31a and 31b, respectively. The power supplies 33a and 33b may be AC power supplies (radio frequency power supplies). When the target 32a and the target 32b are insulators, an AC power supply (radio frequency power supply) is used.

The magnets 34a and 34b are disposed on the back surfaces of the target holders 31a and 31b, respectively. The magnets 34a and 34b apply leakage magnetic fields to the targets 32a and 32b, respectively, to perform magnetron sputtering. The magnets 34a and 34b are configured to move along the back surfaces of the target holders 31a and 31b, respectively, by a magnet driving part (not shown).

Ring-shaped members 36a and 36b for regulating the direction in which the sputtered particles are emitted are disposed at the outer peripheral portions of the surfaces of the targets 32a and 32b, respectively. The ring-shaped members 36a and 36b are grounded.

A voltage may be applied from both power supplies 33a and 33b to both targets 32a and 32b, or may be applied to only one of the targets 32a and 32b. Further, the number of sputtered particle emitting parts is not limited to two.

A target shielding member 81 is disposed below the sputtered particle emitting parts 30a and 30b. The target shielding member 81 has a truncated cone shape corresponding to the shape of the lid 10b of the processing chamber 10, and has an opening 82 having a size corresponding to the size of the targets 32a and 32b. The target shielding member 81 is rotated by a rotating mechanism 83. When the opening 82 is made to correspond to at least one of the targets 32a and 32b, the target corresponding to the opening 82 is opened. On the other hand, the target that does not correspond to the opening(s) 82 is closed. Then, the sputtered particles can be emitted from the target corresponding to the opening 82 to the substrate W. By shielding at least one of the targets 32a and 32b with the shielding member 81, the shielded target can be sputter-cleaned.

A shielding member 84 is disposed above the stage 20 to reach from the outer edge of the upper surface of the stage to the vicinity of the lower end of the target shielding member 81. The shielding member 84 has a function of suppressing sputtered particles from reaching the wall of the processing chamber 10.

The gas supply part 40 has a gas supply source 41, a gas supply line 42 extending from the gas supply source 41, a flow rate controller 43 disposed in the gas supply line 42, and a gas introducing member 44. A rare gas such as Ar is supplied, as a sputtering gas to be excited in the processing chamber 10, from the gas supply source 41 into the processing chamber through the gas supply line 42 and the gas introducing member 44.

By applying a voltage from the power supply 33a and/or 33b to the target 32a and/or 32b via the target holder 31a and/or 31b in a state where the sputtering gas is supplied from the gas supply part 40 into the processing chamber 10, the sputtering gas dissociates around the target 32a and/or 32b. At this time, the leakage magnetic fields of the magnets 34a and 34b reach the vicinity of the target 32a and/or 32b, so that magnetron plasma is generated mainly around the target 32a and/or 32b. In this state, positive ions in the plasma collide with the target 32a and/or 32b, and sputtered particles are emitted from the target 32a and/or 32b and deposited on the substrate W.

The disc shutter part 50 is generally included in this type of device, and has a disc shutter 51, an arm 52, a rotation shaft 53, and a rotation mechanism 54. The disc shutter 51 has a disc shape, has a diameter larger than that of the substrate W. The disc shutter 51 has a function of shielding the substrate W placed on the stage 20. By shielding the substrate W on the stage 20 with the disc shutter 51, it is possible to prevent sputtered particles from reaching the substrate W. The disc shutter 51 is originally intended to shield the substrate W during conditioning or the like. However, in the present embodiment, as will be described later, a thickness of a film formed by deposition of the sputtered particles is measured by the film thickness measuring part 60 prior to the film formation on the substrate W.

The arm 52 functions as a swiveling member for supporting and swiveling the disc shutter 51 via a support member 55.

The rotation shaft 53 is used for swiveling the arm 52. The rotation shaft 53 is connected to the end of the arm 52, and extends vertically downward through the bottom wall of the processing chamber 10. The rotation mechanism 54 is disposed below the processing chamber 10, and rotates the rotation shaft 53. When the rotation shaft 53 is rotated by the rotation mechanism 54, the arm 52 rotates and the disc shutter 51 swivels between a shielding position indicated by a solid line and covering the substrate W and a retracted position indicated by a dashed double-dotted line and retracted from the stage 20 as shown in FIG. 2. When the disc shutter 51 is located at the retracted position, the sputtered particles from the sputtered particle emitting parts 30a and 30b reach the substrate W and, thus, sputtering film formation can be performed.

The film thickness measuring part 60 has a function of measuring a film thickness of a film formed on the disc shutter 51 in the case of performing sputtering film formation in a state of FIG. 1 in which the substrate W is shielded by the disc shutter 51.

In this example, the film thickness measuring part 60 has a plurality of crystal oscillators 61 serving as film thickness measuring devices disposed on the surface of the disc shutter 51. As shown in FIG. 3, for example, five crystal oscillators 61 serving as the film thickness measuring devices are disposed on the surface of the disc shutter 51. In the example of FIG. 3, one crystal oscillator 61 is disposed at the center of the surface of the disc shutter 51, and four crystal oscillators are arranged at regular intervals at the outer peripheral portion of the disc shutter 51.

The crystal oscillator 61 includes a pair of electrodes and a crystal plate embedded between the electrodes. The crystal oscillator 61 vibrates due to piezoelectric properties of crystal by applying an AC voltage to the crystal plate via the electrodes. Since the resonance frequency of the crystal oscillator 61 varies depending on the mass of sputtered particles deposited on the crystal oscillator 61, the film thickness can be detected from the resonance frequency. Further, the film thickness distribution can be obtained from the film thickness measured by the crystal oscillators 61.

Therefore, before the film formation on the substrate W, the state of film formation using the target 32a or 32b can be obtained from the film thickness by performing sputtering film formation on the surface of the disc shutter 51 by applying a voltage from the power supply 33*a* or 33*b* to the target 32*a* or 32*b* through the target holder 31*a* or 31*b* in a state where the substrate W is shielded by the disc shutter 51, as shown in FIG. 1.

The controller 70 is a computer, and controls individual components of the film forming apparatus 1, such as the power supplies 33*a* and 33*b*, the exhaust device 12, the driving mechanism 26, the gas supply part 40, the rotation mechanism 54, and the like. The controller 70 includes a main controller having a central processing unit (CPU) for controlling the above components, an input device, an output device, a display device, and a storage device. The storage device stores parameters of various processes performed by the film forming apparatus 1, and has a storage medium that stores a program, i.e., a processing recipe, for controlling the processes performed by the film forming apparatus 1. The main controller reads out a predetermined processing recipe stored in the storage medium, and causes the film forming apparatus 1 to execute processing based on the processing recipe.

Further, the controller 70 controls power supply to a crystal oscillator power supply (not shown) for supplying a power to the crystal oscillators 61, and receives the resonance frequency detected by the crystal oscillators 61 at the time of performing sputtering film formation on the surface of the disc shutter 51 to calculate the film thickness of the deposited film.

The following is description of the operation of the film forming apparatus 1 configured as described above. The following operations are performed under the control of the controller 70.

First, as shown in FIG. 4, in a state where the disc shutter 50 is retracted, the substrate W is loaded into the processing chamber 10 by a transfer device (not shown) and placed on the stage 20. Next, the disc shutter 51 is rotated by the rotation mechanism 54 via the rotation shaft 53 and the arm 52, and the substrate W on the stage 20 is shielded by the disc shutter 51 as shown in FIG. 1.

Next, the sputtering film formation is performed in the state of FIG. 1. The film forming conditions at this time are basically the same as those for the film formation on the substrate W in a next step. The film formation at this time is performed separately for the target 32*a* and the target 32*b*.

Then, the film thickness of the film deposited using each target is measured by the crystal oscillators 61 serving as the film thickness measuring devices of the film thickness measuring part 60. As described above, the film thickness measuring part 60 detects the film thickness of deposited sputtered particles in response to the change in the resonance frequency of the crystal oscillators 61. Further, the film thickness distribution can be obtained from the film thickness measured by the crystal oscillators 61.

When the substrate W is shielded by the disc shutter 51, the disc shutter 51 is positioned close to the substrate W on the stage 20. Therefore, it is considered that the film thickness obtained by the sputtering film formation on the disc shutter 51 is the same as the film thickness of the film formed on the substrate W. Accordingly, the film thickness obtained by performing the sputtering film formation on the disc shutter 51 is measured by the crystal oscillators 61 serving as the film thickness measuring devices of the film thickness measuring part 60, and the film formation state can be obtained based on the measurement result.

In other words, abnormal film formation in which a film formation rate or film formation distribution suddenly changes may occur due to the progress of erosion of the targets, hardware failure of the film deposition apparatus 1, and the like. If the film formation is performed on the substrate W in that state, product failure may occur. Therefore, prior to the film formation on the substrate W, the sputtering film formation is performed on the disc shutter 51 generally included in a sputtering device and the film thickness is measured by the film thickness measuring part 60 to obtain the film formation state. If it is determined that abnormal film formation such as the change in the film formation rate or the change in the film formation distribution has occurred, it can be appropriately dealt with to prevent abnormal film formation on the substrate W in advance.

Next, the sputtering film formation is performed on the substrate W. The film formation at this time is determined based on the measurement result of the thickness of the film deposited on the disc shutter 51 obtained by the film thickness measuring part 60.

When it is determined in the film thickness measurement using the crystal oscillators 61 of the film thickness measuring part 60 that abnormal film formation has occurred in the film formation using one of the targets 32*a* and 32*b*, the sputtering film formation on the substrate W is performed using the target without abnormality. If both targets are abnormal, the film formation on the substrate W may be performed after maintenance.

When the change in the film formation rate, i.e., abnormal film formation, is detected based on the film thickness measurement result obtained by the film thickness measuring part 60, the abnormal film formation on the substrate W may be avoided by adjusting the film formation time during the film formation on a next substrate W.

If it is determined in the measurement result of the thickness of the film on the disc shutter 51 that there is no abnormal film formation, the film formation on the substrate W may be performed. Further, the film formation rate may be calculated from the measurement result of the thickness of the film deposited on the disc shutter 51, and the calculated film formation rate may be fed back to the film formation on the substrate W in a next step. Accordingly, the film thickness accuracy can be improved during the film formation on the substrate W.

In the sputtering film formation on the substrate W, the disc shutter 51 is retracted from the shielding position A on the substrate W to the retracted position B, resulting in the state shown in FIG. 4. In this state, an inert gas such as Ar gas is introduced as a sputtering gas from the gas supply part 40 into the processing chamber 10, and a pressure in the processing chamber 10 is adjusted to a predetermined pressure by the exhaust device 12. Then, the sputtering film formation is performed while rotating the stage 20 by the driving mechanism 26.

When the target 32*a* is used for the sputtering film formation on the substrate W, plasma is generated by applying a voltage from the power supply 33*a* to the target 32*a* via the target holder 31*a*, and magnetic field is generated by driving the magnet 34*a*. Accordingly, positive ions in the plasma collide with the target 32*a*, and the target 32*a* emits sputtered particles of a metal forming the target 32*a*. The sputtered particles are deposited on the substrate W, thereby forming a desired film.

When the target 32*b* is used, plasma is generated by applying a voltage to the target 32*b* from the power supply 33*b* via the target holder 31*b*, and magnetic field is generated by driving the magnet 34*b*. Accordingly, a desired film is formed on the substrate W.

Further, when sputtered particles are emitted from both the targets 32a and 32b, a voltage may be applied from the power supplies 33a and 33b to the targets 32a and 32b via the target holders 31a and 31b.

If there is an unused target between the targets 32a and 32b, the unused target can be shielded by the target shielding member 81.

After the sputtering film formation is performed, the power supply to the target 32a and/or 32b is stopped, and the processing chamber 10 is purged. Then, the substrate W is unloaded from the processing chamber 10.

The sputtered particle emitting parts 30a and 30b perform dummy run or conditioning prior to the sputtering film formation. In this case, the shutter 51 is retracted, so that an undesired film is not adhered to the crystal oscillators 61 of the film thickness measuring part 60. Accordingly, it is possible to prevent the maintenance cycle of the crystal oscillators 61 from being shortened.

In accordance with the present embodiment, prior to the sputtering film formation on the substrate W, the sputtering film formation on the disc shutter 51 is performed in a state where the substrate is shielded by the disc shutter 51, and the film thickness is measured by the film thickness measuring part 60. Since the thickness of the film formed on the disc shutter 51 close to the substrate W is measured prior to the sputtering film formation on the substrate W, the film thickness, which is identical to the film thickness of the film formed on the substrate W during the film formation on the substrate W, can be detected from the film thickness measurement result. Therefore, by measuring the thickness of the film formed on the disc shutter 51 using the film thickness measuring part 60, the film formation state on the disc shutter 51 can be obtained, and abnormal film formation on the substrate W can be prevented in advance.

The film formation rate is calculated from the measurement result of the thickness of the film deposited on the disc shutter 51, and the result is fed back to the controller 70 so that the result can be reflected in the process recipe at the time of performing film formation on the substrate in a next step. Accordingly, the film thickness accuracy can be improved in the film formation on the substrate W.

Other Applications

While the embodiments of the present disclosure have been described, it should be noted that the embodiments of the present disclosure are illustrative in all respects and are not restrictive. The above-described embodiments may be omitted, replaced, or changed in various forms without departing from the scope of the appended claims and the gist thereof.

For example, in the above embodiment, the case where the crystal oscillators are used as the film thickness measuring devices of the film thickness measuring part has been described. However, the present disclosure is not limited thereto, and another film thickness measuring device such as a device using an optical sensor or the like may be used. Further, the number of film thickness measuring devices may be one or more without being limited to that in the above embodiment.

Although the case of using a sputtering apparatus as a film forming apparatus has been described, the present disclosure is not limited thereto, and may be applied to various film forming apparatuses.

The invention claimed is:

1. A film forming apparatus for performing film formation on a substrate, comprising:
a processing chamber;
a stage configured to place thereon a substrate disposed in the processing chamber;
a first film forming part configured to perform film formation on the substrate placed on the stage;
a shutter that is movable between a shielding position where the substrate on the stage is shielded and a retracted position retracted from the stage and where the first film forming part performs the film formation on the substrate;
a film thickness measuring part having a film thickness measuring device configured to measure a film thickness of a film formed on the shutter at the shielding position by the first film forming part; and
a controller configured to control processing in the film forming apparatus,
wherein the controller determines film formation on the substrate based on a film thickness measurement result obtained by the film thickness measuring device, and
wherein a second film forming part is provided, and when abnormal film formation is detected from the film thickness measurement result after a film is formed on the shutter by the first film forming part, the controller controls the second film forming part to perform the film formation on the substrate.

2. The film forming apparatus of claim 1, wherein the film thickness measuring part has multiple film thickness measuring devices.

3. The film forming apparatus of claim 1, wherein the film thickness measuring device has a crystal oscillator disposed on a surface of the shutter.

4. The film forming apparatus of claim 1, wherein the first film forming part has a sputtered particle emitting part configured to emit sputtered particles from a target to the substrate placed on the stage, and is configured to perform the film formation by sputtering.

5. The film forming apparatus of claim 1, wherein when a change in a film formation rate is detected from the film thickness measurement result obtained by the film thickness measuring device, the controller adjusts film formation time in the film formation on the substrate.

6. The film forming apparatus of claim 1, wherein the controller calculates a film formation rate from the film thickness of the film on the shutter measured by the film thickness measuring device, and provides feedback on the calculated film formation rate during the film formation on the substrate.

7. A film forming method for performing film formation process on a substrate, by using a film forming apparatus including a processing chamber, a stage configured to place thereon a substrate disposed in the processing chamber, a first film forming part configured to perform film formation on the substrate placed on the stage, a shutter that is movable between a shielding position where the substrate on the stage is shielded and a retracted position retracted from the stage, and a film thickness measuring part having a film thickness measuring device configured to measure a film thickness of a film formed on the shutter at the shielding position by the first film forming part, the film forming method comprising:
locating the shutter at a shielding position;
forming a film on the shutter using the first film forming part;

measuring a thickness of the film on the shutter using the film thickness measuring device of the film thickness measuring part; and locating the shutter at a retracted position and performing film formation on the substrate based on a film thickness measurement result obtained by the film thickness measuring device, wherein the film forming apparatus includes a second film forming part, and when abnormal film formation is detected from the film thickness measurement result after a film is formed on the shutter by the first film forming part, said performing film formation on the substrate is performed by the second film forming part.

8. The film forming method of claim 7, wherein when a change in a film formation rate is detected from the film thickness measurement result obtained in said measuring the thickness of the film, film formation time is adjusted during the film formation on the substrate.

9. The film forming method of claim 7, further comprising:

calculating a film formation rate from the film thickness obtained in said measuring the thickness of the film, and providing feedback on the calculated film formation rate during the film formation on the substrate.

10. The film forming method of claim 7, wherein the film thickness measuring part has multiple film thickness measuring devices.

11. The film forming method of claim 7, wherein the film thickness measuring device has a crystal oscillator disposed on a surface of the shutter.

12. The film forming method of claim 7, wherein the first film forming part has a sputtered particle emitting part configured to emit sputtered particles from a target to the substrate placed on the stage, and is configured to perform the film formation by sputtering.

* * * * *